(12) United States Patent
Chang et al.

(10) Patent No.: US 8,907,479 B2
(45) Date of Patent: Dec. 9, 2014

(54) TREATING COPPER SURFACES FOR PACKAGING

(71) Applicant: Taiwan Semiconductor Manufacturing Company, Ltd., Hsin-Chu (TW)

(72) Inventors: Chih-Horng Chang, Taipei (TW); Tin-Hao Kuo, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/794,698

(22) Filed: Mar. 11, 2013

(65) Prior Publication Data

US 2014/0252600 A1    Sep. 11, 2014

(51) Int. Cl.
*H01L 23/485* (2006.01)
*H01L 21/56* (2006.01)
*H01L 23/498* (2006.01)

(52) U.S. Cl.
CPC ........ *H01L 23/49811* (2013.01); *H01L 21/563* (2013.01)

USPC .................................. 257/737; 257/E23.021

(58) Field of Classification Search
CPC .......... H01L 2224/05147; H01L 2224/16145; H01L 2224/81; H01L 2224/73203; H01L 2224/14051; H01L 2224/1601; H01L 2225/1058; H01L 23/53238
USPC ......................................................... 257/737
See application file for complete search history.

(56) References Cited

U.S. PATENT DOCUMENTS

2007/0148949 A1*  6/2007  Suh et al. ....................... 438/612
2012/0119359 A1*  5/2012  Im et al. ......................... 257/737

* cited by examiner

*Primary Examiner* — Kevin M Picardat
*Assistant Examiner* — Paul Patton
(74) *Attorney, Agent, or Firm* — Slater & Matsil, L.L.P.

(57) ABSTRACT

A die has a top surface, and a metal pillar having a portion protruding over the top surface of the die. A sidewall of the metal pillar has nano-wires. The die is bonded to a package substrate. An underfill is filled into the gap between the die and the package substrate.

21 Claims, 8 Drawing Sheets

US 8,907,479 B2

TREATING COPPER SURFACES FOR PACKAGING

BACKGROUND

In the formation of integrated circuits, devices such as transistors are first formed at the surface of a semiconductor substrate, which is a part of a wafer. Interconnect structures are then formed over the semiconductor substrate and the devices. Electrical connectors such as metal bumps are formed on the surface of the semiconductor wafer, so that the devices can be accessed. The wafer is sawed into a plurality of semiconductor dies.

The packaging of the semiconductor dies may be performed through reflow processes. In the packaging, solder regions are reflowed to bond the semiconductor dies to other package components such as device dies, interposers, package substrates, or the like. After the bonding, a gap may exist between a semiconductor die and the respective bonding package component. An underfill is typically dispensed into the gap and cured. The underfill protects the solder regions and the surrounding structures.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A method for treating connectors and bonding the respective dies comprising the connectors are provided in accordance with various embodiments. The intermediate stages of the treatment and the bonding process are illustrated in accordance with exemplary embodiments. The variations of the embodiments are discussed. Throughout the various views and illustrative embodiments, like reference numbers are used to designate like elements.

Figure 1:
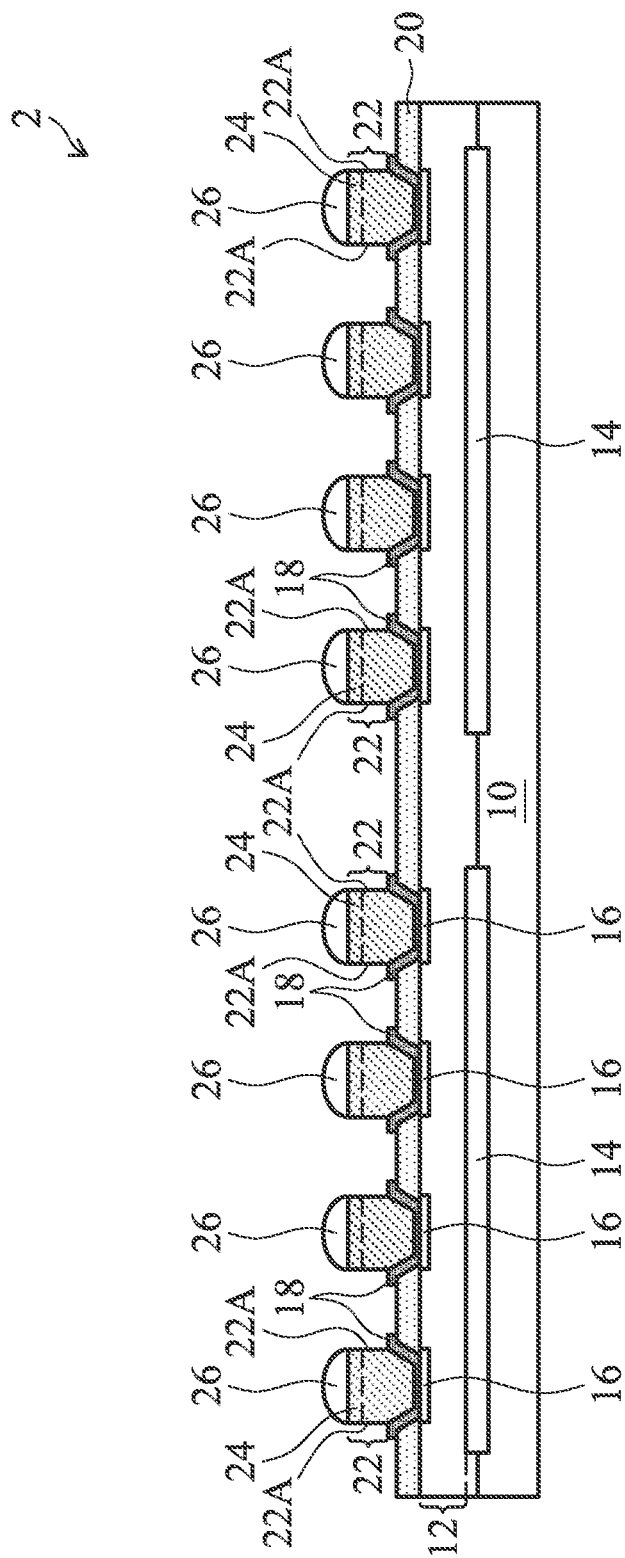
FIGS. 1 through 5 are cross-sectional views of intermediate stages in the formation and the sawing of a wafer in accordance with embodiments.

Referring to FIG. 1, wafer 2 is provided. In some embodiments, wafer 2 is a device wafer. Substrate 10 in wafer 2 may thus be a semiconductor substrate such as a silicon substrate, although it may be formed of other semiconductor materials, such as silicon germanium, silicon carbon, gallium arsenide, or the like. Semiconductor devices 14, which may include transistors, diodes, resistors, and/or the like, may be formed at the surface of substrate 10. Interconnect structure 12 is further formed over substrate 10. Interconnect structure 12 may include dielectric layers (not shown), which may include an inter-layer dielectric and inter-metal dielectrics (IMDs). Interconnect structure 12 further includes metal lines and vias (not shown) formed in the dielectric layers and electrically coupled to semiconductor devices 14. The metal lines and vias may be formed of copper or copper alloys.

In alternative embodiments, wafer 2 is an interposer wafer, and is substantially free from active devices (such as transistors) and passive devices (such as resistors, capacitors, inductors, and/or the like). In these embodiments, substrate 10 may be formed of a semiconductor material or a dielectric material, and electrical connectors may be formed on opposite sides of substrate 10, and electrically coupled to each other. In alternative embodiments, wafer 2 is an interposer wafer, and is substantially free from active devices, but include passive devices.

Metal pads 16 are formed over interconnect structure 12. Metal pads 16 may comprise aluminum (Al), copper (Cu), silver (Ag), gold (Au), nickel (Ni), tungsten (W), alloys thereof, and/or multi-layers thereof. In some exemplary embodiments, metal pads 16 comprise aluminum copper. Metal pads 16 may be electrically coupled to semiconductor devices 14, for example, through the underlying interconnect structure 12. In some embodiments, a passivation layer(s) (not shown) is formed to cover edge portions of metal pads 16. The passivation layer may be formed of silicon oxide, silicon nitride, or multi-layers thereof.

Under-Bump metallurgies (UBMs) 18 are formed over and electrically coupled to metal pads 16. In some embodiments, as shown in FIG. 1, UBMs 18 are formed over and in contact with metal pads 16. In alternative embodiments, a Post-Passivation Interconnect (PPI, not shown) structure is formed to electrically couple metal pads 16 to UBMs 18, wherein UBMs 18 may land on the pads of the PPI. In some exemplary embodiments, each of UBMs 18 includes a barrier layer (not shown) and a seed layer (not shown) over the barrier layer. The barrier layer may extend into the opening in top dielectric layer 20, which may comprise a polymer such as polyimide, benzocyclobutene (BCB), polybenzoxazole (PBO), or the like. The Barrier layer may be a titanium layer, a titanium nitride layer, a tantalum layer, a tantalum nitride layer, or layers formed of a titanium alloy or a tantalum alloy. The materials of the seed layer may include copper or copper alloys, although other metals such as silver, gold, aluminum, palladium, nickel, nickel alloys, tungsten alloys, chromium, chromium alloys, and combinations thereof may also be used.

Metal pillars 22 are formed over, and electrically couple to, UBMs 18. Portions of metal pillars 22 protrude above dielectric layer 20, which is the surface dielectric layer of wafer 2. In some embodiments, metal pillars 22 are formed through plating. Each of metal pillars 22 may include at least a lower portion comprising copper, a copper alloy, or the like. In some exemplary embodiments, the weight percentage of copper in the lower portion of metal pillars 22 is greater than about 98 percent, and may be greater than about 99.5 percent. Metal pillars 22 may also include substantially pure copper. Furthermore, metal pillars 22 may not include hydrogen and carbon therein when plated. Solder regions 26 are formed on the top surface of metal pillars 22, and may comprise a Sn—Ag solder, a Sn—Cu solder, a Sn—Ag—Cu solder, or the like. Solder regions 26 may be lead-free or lead-containing, e.g. a Sn—Pb eutectic alloy. The formation of solder regions 26 includes plating a solder layer over each of metal pillars 22, and reflowing the solder layer to form solder regions 26. After the reflow, solder regions 26 have rounded top surfaces. The lower portions of metal pillars 22, on the other hand, are formed of non-reflowable materials that do not melt under the typical melting temperatures of solders. Hence, the sidewall surfaces 22A of metal pillars 22 may remain to be substantially vertical after the reflow.

In some embodiments, each of metal pillars 22 includes metal layer 24 as a top portion, wherein metal layer 24 may comprise nickel, palladium, and the like. In alternative embodiments, metal layer 24 is not formed, and the entirety of each of metal pillars 22 may be copper-containing pillars.

In some embodiments, the formation of UBMs 18, metal pillars 22, and pre-solder regions 26 includes forming a blanket UBM layer (not shown, wherein UBMs 18 are parts of the blanket UBM layer) using Physical Vapor Deposition (PVD) or other applicable methods. A mask layer such as a photo resist (not shown) is then formed and patterned, so that portions of the blanket UBM layer are exposed. Metal pillars 22 and pre-solder regions 26 are then plated in the openings of the mask layer and over the blanket UBM layer. The mask layer is then removed, followed by the removal of portions of the blanket UBM layer, which portions are not covered by metal pillars 22 and pre-solder regions 26.

Figure 2:
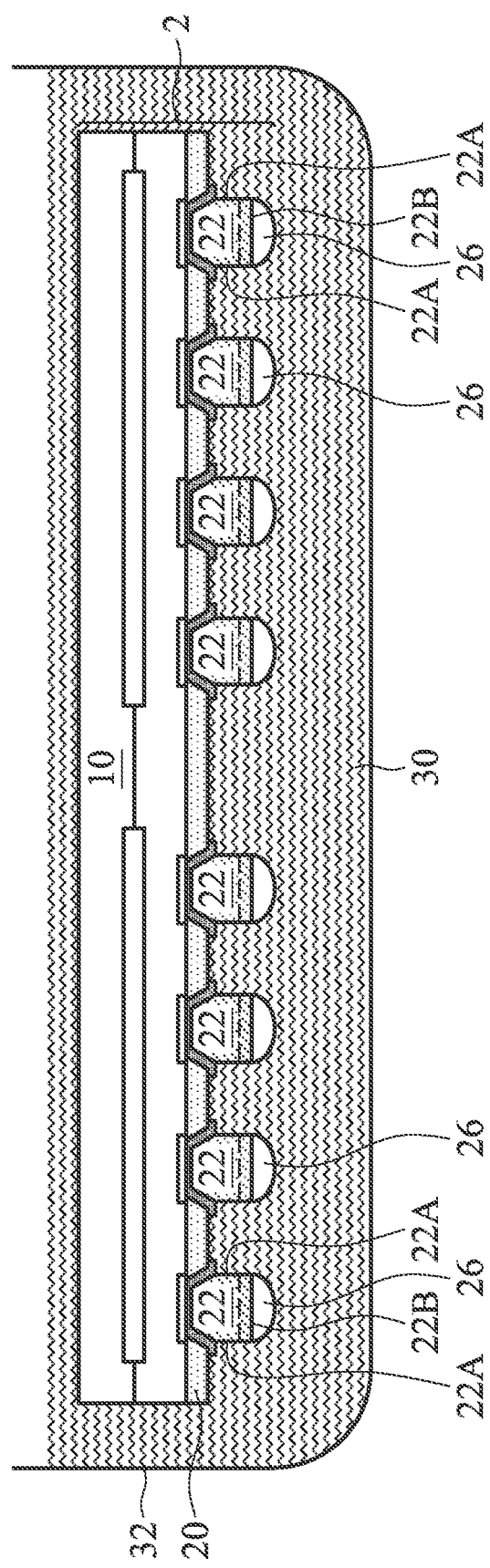

Referring to FIG. 2, a chemical treatment is performed on wafer 2. In some embodiments, the chemical treatment includes treating wafer 2 in chemical solution 30, which is held in container 32. Chemical solution 30 includes water soluble chemicals such as sodium chlorite ($NaClO_2$), sodium hydroxide (NaOH), and/or sodium phosphate ($NaPO_4$) dissolved in water. In some embodiments, chemical solution 30 may be made by dissolving, in each liter of water, between about 18 grams and about 75 grams of $NaClO_2$, between about 5 grams and about 20 grams of NaOH, and between about 50 grams and about 200 grams of $NaPO_4*12H_2O$. Hence, the weight percentage (including the weight of water) of $NaClO_2$ may be between about 1.6 percent and about 5.8 percent, the weight percentage of NaOH may be between about 0.5 percent and about 1.5 percent, and the weight percentage of $NaPO_4*12H_2O$ may be between about 4.7 percent and about 15.5 percent.

Figure 3:
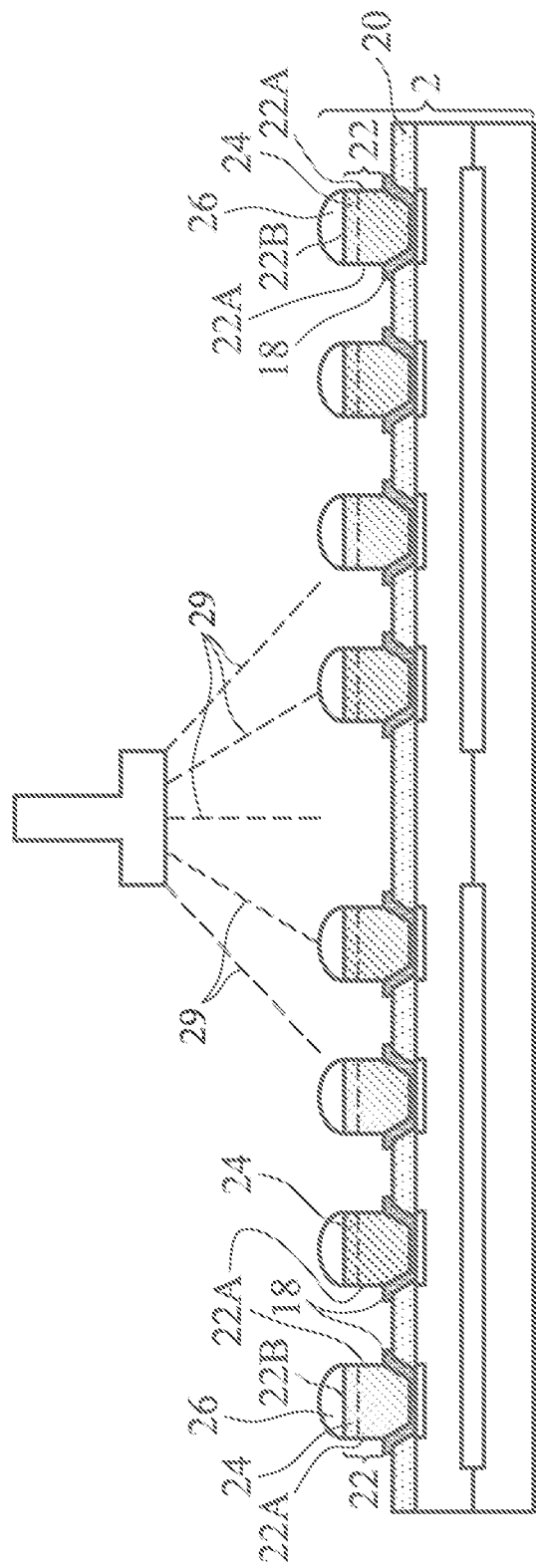

During the chemical treatment, chemical solution 30 may be heated, for example, to a temperature between about 70° C. and about 100° C. Wafer 2 is submerged in chemical solution 30, for example, for a period of time between about 10 minutes and about 40 minutes. After the chemical treatment, wafer 2 is retrieved from chemical solution 30, and is rinsed using deionized water 29, as shown in FIG. 3. As a result of the rinsing, the residue chemicals on the surface of wafer 2 are removed.

As also shown in FIG. 3, metal pillars 22 include sidewall surfaces 22A and top surfaces 22B. Top surfaces 22B may be covered by solder regions 26. Furthermore, in some embodiments, the copper-containing portions of metal pillars 22 may be covered by metal layers 24, which comprise nickel, palladium, or the like. Sidewall surfaces 22A of metal pillars 22 are exposed to, and are treated by, chemical solution 30. Hence, sidewall surfaces 22A, as a result of the chemical treatment, become grassplot-like. In the embodiments wherein metal layers 24 are formed, the grassplot-like structure is formed on the sidewall surfaces 22A of the copper-containing portions of metal pillars 22, while the sidewall surfaces of metal layers 24 may not have the grassplot-like structures formed thereon.

Figure 4:
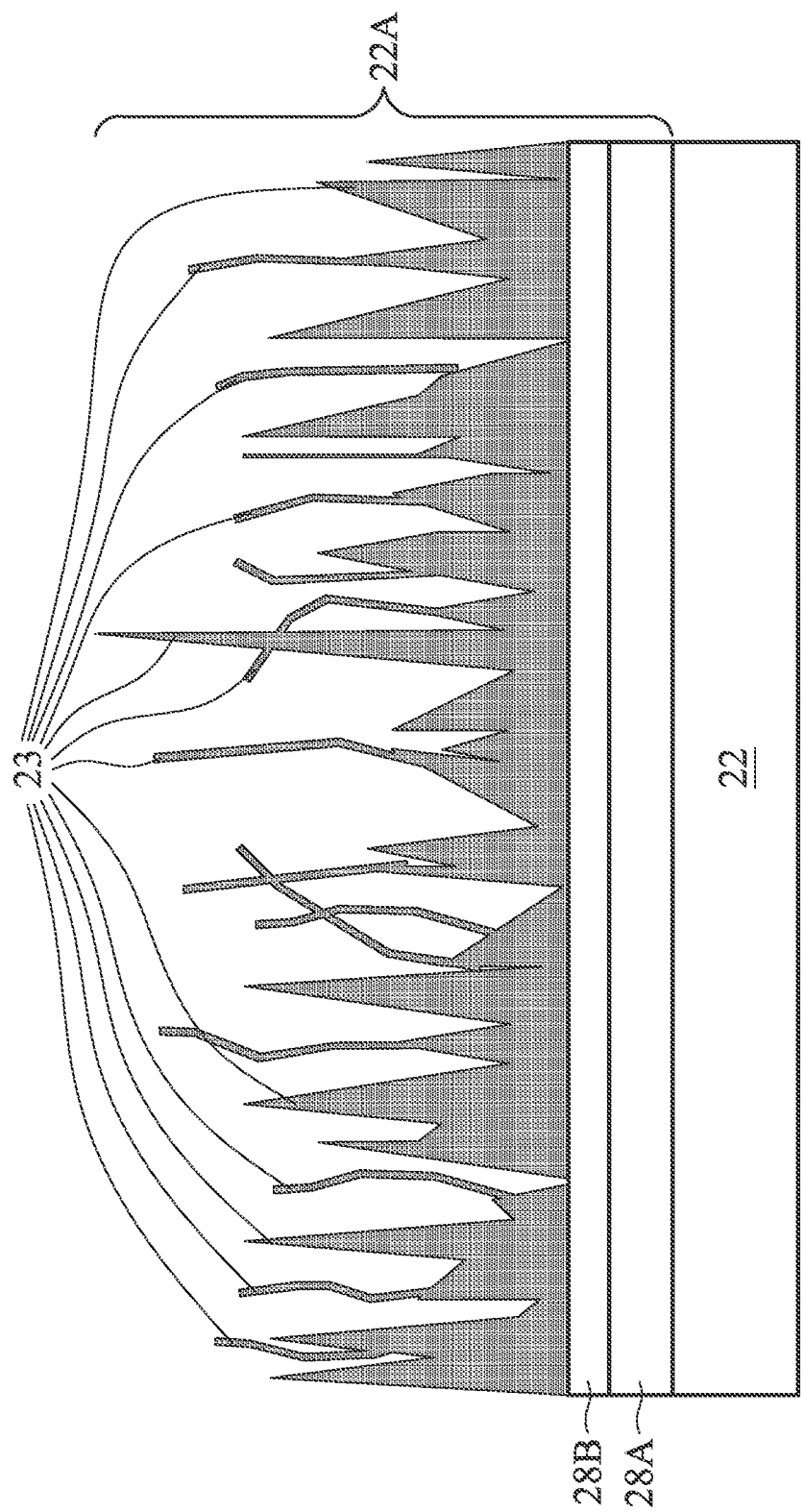

FIG. 4 illustrates a schematic cross-sectional view of treated sidewall surfaces 22A. The patterns illustrated in FIG. 4 reflect the view obtained using X-ray Photoelectron Spectroscopy (XPS), which is used to inspect sidewall surfaces 22A. As shown in FIG. 4, sidewall surfaces 22A include dense nano-wires 23, which comprise $Cu_2O$ crystal. In some embodiments, although nano-wires 23 may tilt or curve lightly, nano-wires 23 may overall extend in a direction perpendicular to the plane of the respective sidewall surfaces 22A. Hence, nano-wires 23 may have a general direction parallel to the top surface of wafer 2 (FIG. 3), which top surface of wafer 2 may also be the top surface of dielectric layer 20 (FIG. 3). Nano-wires 23 may have an average pitch smaller than about 500 nm. The average surface roughness of sidewall surfaces 22A may be greater than about 40 nm, and may be between about 40 nm and 80 nm in some embodiments. The average surface roughness may also be greater than about 80 nm, and may be greater than about 120 nm in some embodiments. Furthermore, the ratio of the average length of nano-wires 23 to the average width may be greater than about 1.5, and may be greater than about 5, or greater than about 10 in some embodiments. The XPS analysis further indicates that nano-wires 23 include Cu and $Cu_2O$. The XPS results revealed that layer 28B, which comprises CuO, may exist between nano-wires 23 and layer 28A, which is formed of $Cu_2O$. Layer 28A may be in contact with metal pillar 22.

Referring to FIG. 3, due to the protection of solder regions 26, nano-wires 23 are not formed on top surfaces 22A of metal pillars 22. Nano-wires 23 also may not form on solder regions 26 and/or metal layers 24. Since nano-wires 23 have a general extending direction (lengthwise direction) perpendicular to surface 22A, nano-wires 23 may be substantially parallel to the top surface of wafer 2.

Energy Dispersive Spectrometer (EDS) analysis was also performed on sidewall surfaces 22A. The EDS results revealed that nano-wires 23 may include copper monoxide (CuO), with an atomic percentage of CuO in nano-wires 23 being greater than about 15 percent, or greater than about 20 percent. This atomic percentage is higher than the atomic percentage (about 13 percent) in nature copper oxide that is formed by exposing copper in air. Furthermore, nano-wires 23 comprise a significant percentage of hydrogen atoms and carbon atoms. The EDS analysis results indicated that nano-wires 23 comprise copper hydroxide ($Cu(OH)_2$) and/or copper carbonate ($CuCO_3$). For example, the EDS analysis results indicated that the total atomic percentage of $Cu(OH)_2$ and $CuCO_3$ may be greater than about 60 percent. This is also significantly higher than the respective atomic percentage (about 13 percent) in the nature copper oxide. The atomic percentage of the combination of Cu and $Cu_2O$ (referred to as $Cu+Cu_2O$ hereinafter) may also be smaller than about 15 percent. This is significantly lower than the respective atomic percentage (about 74 percent) in the nature copper oxide.

Figure 5:
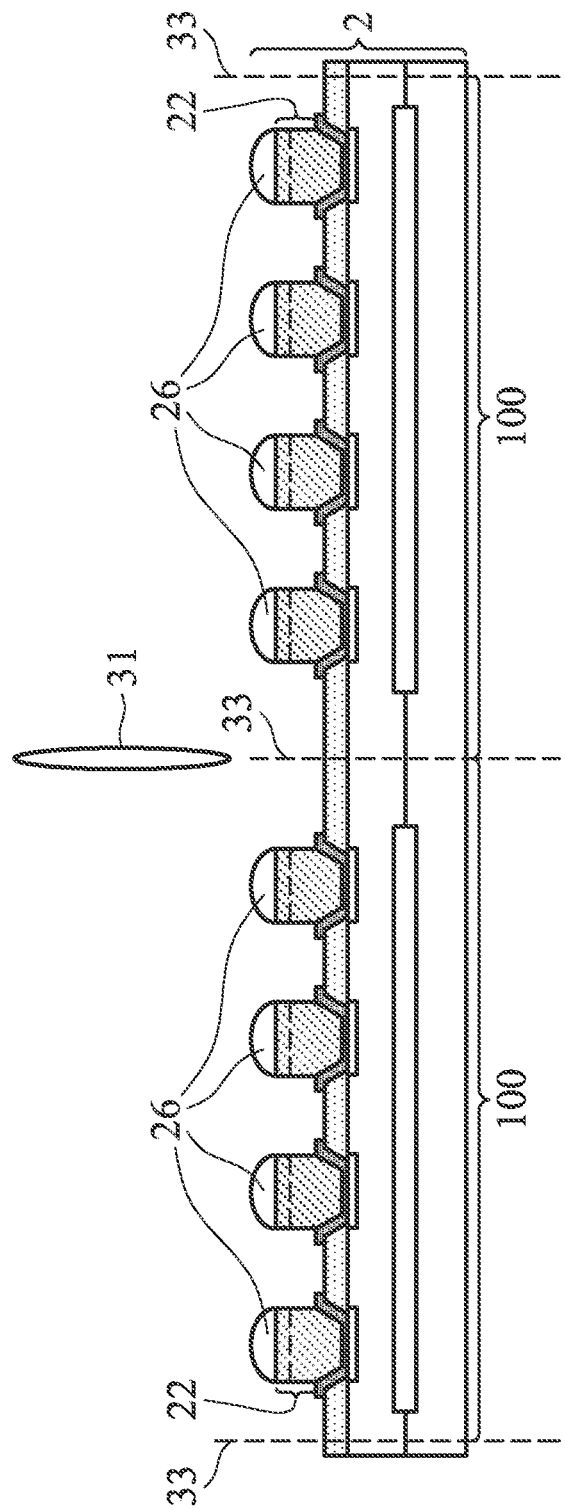
Figure 6:
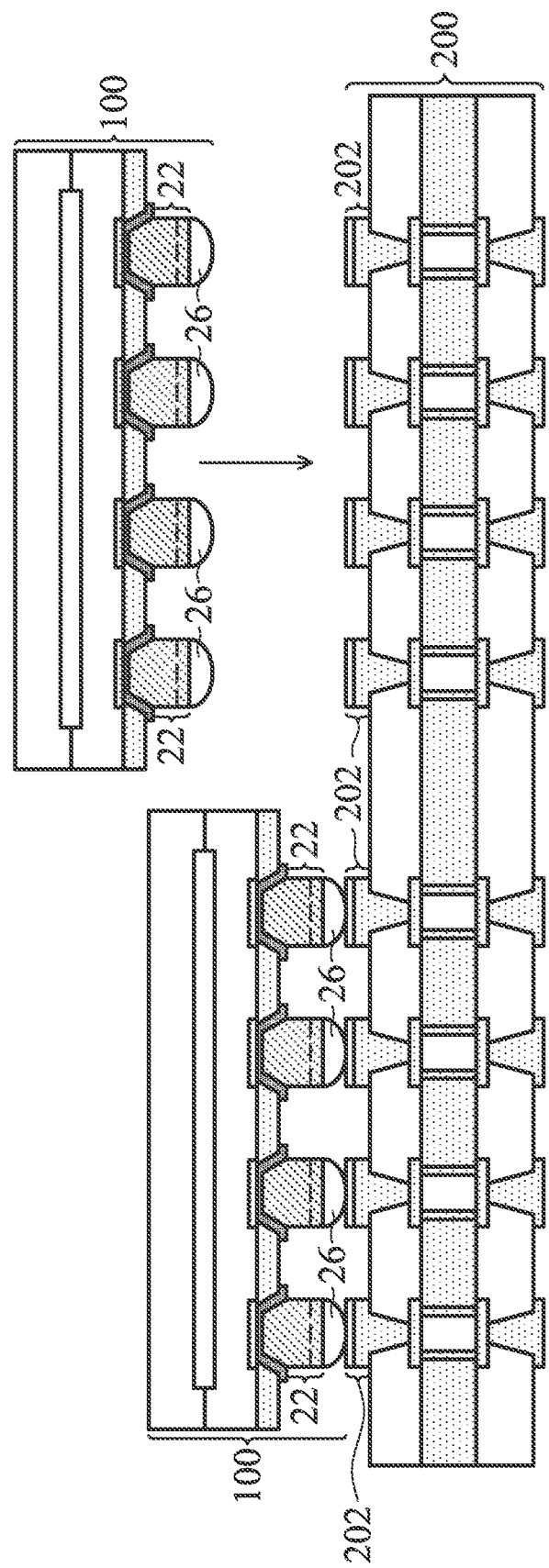
FIGS. 6 through 8 illustrate cross-sectional views in the bonding of a package component sawed from the wafer to another package component in accordance with various embodiments.
Figure 7:
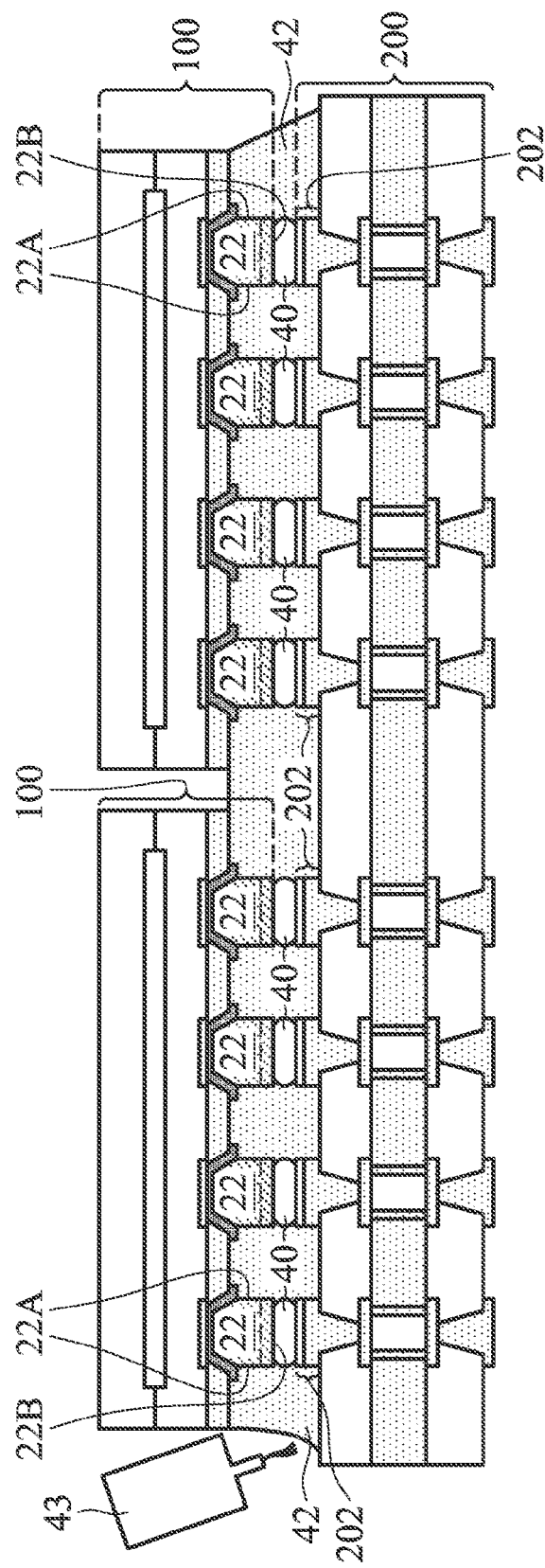

In subsequent steps, as shown in FIG. 5, a die saw is performed to saw wafer 2 into dies (also referred to as chips) 100. The die saw may be performed using blade 31, which cuts through scribe lines 33 of wafer 2. Next, as shown in FIGS. 6 and 7, dies 100 are bonded to package component 200 through solder bonding. As shown in FIG. 6, dies 100 are placed over package component 200. Package component 200 may be a package substrate, which may be a build-up substrate in accordance with exemplary embodiments. In alternative embodiments, package component 200 may be an interposer, a Printed Circuit Board (PCB), or the like. Package component 200 includes metal connectors 202, which may be metal pads, for example. Pre-solder regions (not shown) may also be formed as the top portions of metal connectors 202. Dies 100 are placed with pre-solder regions 26 against metal connectors 202. After the placement of each of dies 100, the respective die 100 is lightly pressed, so that it may stay on package component 200.

After all dies 100 are placed on package component 200, a reflow is performed, and the resulting structure is shown in FIG. 7. Solder regions 26 (FIG. 7) and the solder regions, if any, on package component 200 are thus reflowed to form solder regions 40. Next, as also shown in FIG. 7, underfill 42 is dispensed into the gaps between dies 100 and package component 200, for example, using dispenser 43. The dispensed underfill 42 is then cured, and hence is solidified. Underfill 42 is in contact with sidewall surfaces 22A of metal pillars 22.

Figure 8:
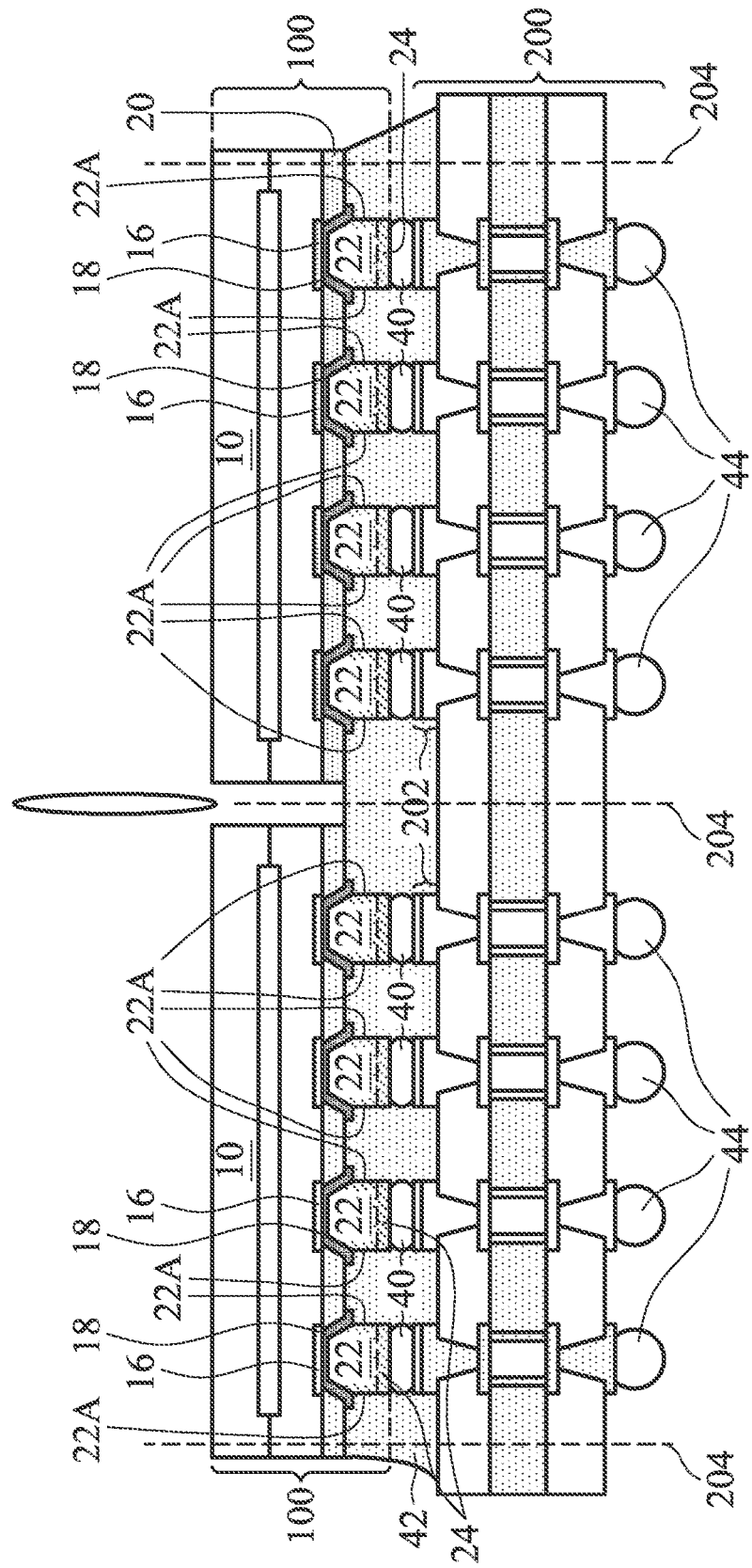

Referring to FIG. 8, solder balls 44 are placed on a side of package component 200, which side is opposite to the side dies 100 are bonded to. Solder balls 44 are then reflowed. The structure shown in FIG. 8 may then be sawed part into a plurality of packages along scribe lies 204, with each of the packages include one piece of package component 200 and one of dies 100.

Due to the existence of nano-wires 23 (FIG. 4), sidewall surfaces 22A (FIG. 8) of metal pillars 22 are much more rough than the surface of nature copper oxide. Underfill 42 is in contact with nano-wires 23, and may fill the gaps between nano-wires 23. This results in the generation of the interlock force between nano-wires 23 and underfill 42, and hence the adhesion between underfill 42 and metal pillars 22 is improved. Experiment results indicated that by performing the chemical treatment (FIG. 2) in accordance with the embodiments of the present disclosure, the adhesion force between the treated sidewall surfaces 22A and underfill 42 is twice the adhesion force between the un-treated sidewalls of the metal pillars in dies 100 and underfill. With the better adhesion between sidewall surfaces 22A and underfill 42, sidewall surfaces 22A and underfill 42 are unlikely to have delamination. If the treatment is not performed, however, the likelihood of the delamination between sidewall surfaces 22A and underfill 42 is higher. When the delamination occurs, the delamination may further expand to the interface between underfill 42 and dielectric layer 20 in chips 100, causing reliability problems to the resulting package.

In accordance with some embodiments, a die has a top surface, and a metal pillar having a portion protruding over the top surface of the die. A sidewall of the metal pillar has nano-wires. The die is bonded to a package substrate. An underfill is filled into the gap between the die and the package substrate.

In accordance with other embodiments, a package includes a die, a package substrate, and a solder region bonding the top surface of the die to the package substrate. The die includes a copper pillar at a top surface of the die, wherein sidewalls of the copper pillar include nano-wires, with the nano-wires comprising copper carbonate ($CuCO_3$). A top surface of the copper pillar is substantially free from copper carbonate.

In accordance with yet other embodiments, a method includes performing a chemical treatment on a chip to generate nano-wires on a sidewall of a metal pillar. The metal pillar is comprised in the chip, and protrudes beyond a top surface of the chip. The chip is bonded to a package component, wherein a solder region joins a top surface of the metal pillar to the package component. An underfill is dispensed between the chip and the package component, wherein the underfill is in contact with the sidewall of the metal pillar.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a die comprising:
      a top surface; and
      a metal pillar comprising a portion protruding over the top surface of the die, wherein a sidewall of the metal pillar comprises nano-wires, wherein the nano-wires have lengthwise directions having a general trend substantially parallel to the top surface of the die.

2. The device of claim 1, wherein the metal pillar comprises a solder region on a top surface of the metal pillar, and wherein the top surface is free from nano-wires.

3. The device of claim 1, wherein the nano-wires comprise copper hydroxide ($Cu(OH)_2$) and copper carbonate ($CuCO_3$).

4. The device of claim 1, wherein the nano-wires have an average roughness greater than about 40 nm.

5. The device of claim 1, wherein the nano-wires have an average pitch smaller than about 500 nm.

6. The device of claim 1 further comprising:
   a package component, with the metal pillar bonded to the package component through a solder region, wherein the solder region is on a top surface of the metal pillar; and
   an underfill in a gap between the package component and the die, wherein the underfill in in physical contact with the nano-wires.

7. A package comprising:
   a die comprising:
      a copper pillar at a top surface of the die, wherein sidewalls of the copper pillar comprise nano-wires, with the nano-wires comprising copper carbonate ($CuCO_3$), and wherein a top surface of the copper pillar is substantially free from copper carbonate;
   a package substrate; and
   a solder region bonding the top surface of the die to the package substrate.

8. The package of claim 7, wherein the nano-wires further comprise copper hydroxide ($Cu(OH)_2$), and wherein a total atomic percentage of the copper hydroxide and the copper carbonate is higher than about 60 percent.

9. The package of claim 7 further comprising:
   a copper monoxide layer (CuO) over the copper pillar; and
   a copper oxide ($Cu_2O$) layer between the copper monoxide layer and the copper pillar.

10. The package of claim 7, wherein a ratio of an average length of the nano-wires to an average width of the nano-wires is greater than about 1.5.

11. The package of claim 7, wherein the nano-wires have an average roughness greater than about 120 nm.

12. The package of claim 7, wherein the nano-wires have an average pitch smaller than about 500 nm.

13. The package of claim 7, wherein a first atomic percentage of the copper carbonate is higher than a second atomic percentage of the copper carbonate in nature copper oxide.

14. A method comprising:
   performing a chemical treatment on a chip to generate nano-wires on a sidewall of a metal pillar, wherein the metal pillar is comprised in the chip, and protrudes beyond a top surface of the chip, wherein the nano-wires comprises copper oxide;

bonding the chip to a package component, wherein a solder region joins a top surface of the metal pillar to the package component; and dispensing an underfill between the chip and the package component, wherein the underfill is in contact with the sidewall of the metal pillar.

15. The method of claim 14, wherein the chemical treatment is performed on a wafer having the chip therein, and wherein the method further comprises, after the chemical treatment and before the step of bonding, performing a die saw on the wafer to separate the chip from the wafer.

16. The method of claim 14, wherein the chemical treatment is performed by treating the die in a chemical solution, and wherein the chemical solution comprises a chemical dissolved in water, and wherein the chemical is selected from the group consisting essentially of sodium chlorite ($NaClO_2$), sodium hydroxide (NaOH), sodium phosphate ($NaPO_4$), and combinations thereof.

17. The method of claim 16, wherein the chemical comprises $NaClO_2$, NaOH, and $NaPO_4$.

18. The method of claim 16, wherein the chemical treatment is performed with a temperature of the chemical solution between about 70° C. and about 100° C.

19. The method of claim 14, wherein the chemical treatment is performed for a period of time between about 10 minutes and about 40 minutes.

20. The device of claim 1, wherein the nano-wires comprise dielectric nano-wires.

21. The method of claim 14, wherein the nano-wires comprise dielectric nano-wires.

* * * * *